United States Patent
Philip et al.

(10) Patent No.: US 11,283,015 B2
(45) Date of Patent: Mar. 22, 2022

(54) PROJECTED PHASE CHANGE MEMORY DEVICES

(71) Applicant: INTERNATIONAL BUSINESS MACHINES CORPORATION, Armonk, NY (US)

(72) Inventors: Timothy Mathew Philip, Albany, NY (US); Nicole Saulnier, Slingerlands, NY (US); Lawrence A. Clevenger, Saratoga Springs, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 134 days.

(21) Appl. No.: 16/828,328

(22) Filed: Mar. 24, 2020

(65) Prior Publication Data

US 2021/0305503 A1    Sep. 30, 2021

(51) Int. Cl.
*H01L 45/00* (2006.01)

(52) U.S. Cl.
CPC ............ *H01L 45/126* (2013.01); *H01L 45/06* (2013.01); *H01L 45/144* (2013.01); *H01L 45/1675* (2013.01)

(58) Field of Classification Search
CPC . H01L 45/126; H01L 45/1226; H01L 45/144; H01L 45/1675; H01L 45/06
See application file for complete search history.

(56) References Cited

U.S. PATENT DOCUMENTS

| | | | |
|---|---|---|---|
| 6,831,856 B2 | 12/2004 | Pashmakov | |
| 7,639,526 B2 | 12/2009 | Pellizzer et al. | |
| 8,471,236 B2 | 6/2013 | Breitwisch et al. | |
| 9,082,954 B2 | 7/2015 | Lung | |
| 9,293,199 B2 | 3/2016 | Krebs et al. | |
| 9,570,169 B1 | 2/2017 | Czornomaz et al. | |
| 10,395,734 B2 | 8/2019 | Papandreou et al. | |
| 2008/0068878 A1 | 3/2008 | Nirschl et al. | |
| 2009/0072216 A1* | 3/2009 | Lung | H01L 45/144 257/4 |

FOREIGN PATENT DOCUMENTS

EP     2034536 A1    3/2009

OTHER PUBLICATIONS

Koelmans et al., "Projected Phase-Change Memory Devices", Nature Communications, Sep. 2015, pp. 1-7.

* cited by examiner

*Primary Examiner* — Allison Bernstein
(74) *Attorney, Agent, or Firm* — Tutunjian & Bitetto, P.C.; Randall Bluestone

(57) ABSTRACT

A method of forming a phase change memory device is provided. The method includes forming a spacer layer on a substrate, and forming a heater terminal contact in the spacer layer. The method further includes forming a liner layer on the heater terminal contact and the spacer layer, and forming a heater terminal in electrical contact with the heater terminal contact in the liner layer. The method further includes forming a conductive projection segment on the heater terminal. The method further includes forming a phase change material layer on the conductive projection segment, and forming a phase change material terminal on the phase change material layer, wherein an electrical current can pass between the heater terminal and the phase change material terminal through the phase change material layer.

20 Claims, 7 Drawing Sheets

PROJECTED PHASE CHANGE MEMORY DEVICES

BACKGROUND

The present invention generally relates to phase change memory devices having a projection segment, and more particularly to phase change memory devices having increased performance linearity from patterned projection segments.

Phase change memory can use the difference in resistivity between an amorphous phase and a crystalline phase of a phase change material (PCM) to establish a state of a memory cell, where the crystalline and amorphous states of the phase change memory material can have detectably different electrical resistivity values. The amorphous state of the phase change memory material can have a high resistivity.

SUMMARY

In accordance with an embodiment of the present invention, a method of forming a phase change memory device is provided. The method includes forming a spacer layer on a substrate, and forming a heater terminal contact in the spacer layer. The method further includes forming a liner layer on the heater terminal contact and the spacer layer, and forming a heater terminal in electrical contact with the heater terminal contact in the liner layer. The method further includes forming a conductive projection segment on the heater terminal. The method further includes forming a phase change material layer on the conductive projection segment, and forming a phase change material terminal on the phase change material layer, wherein an electrical current can pass between the heater terminal and the phase change material terminal through the phase change material layer.

In accordance with another embodiment of the present invention, a method of forming a phase change memory device is provided. The method includes forming a spacer layer on a substrate having a thickness in a range of about 20 nanometers (nm) to about 300 nm. The method further includes forming a heater terminal contact in the spacer layer, and forming a liner layer on the heater terminal contact and the spacer layer. The method further includes forming a heater terminal in electrical contact with the heater terminal contact in the liner layer, and forming a capping layer on the liner layer and the heater terminal. The method further includes forming a trench in the capping layer above the heater terminal, and forming a conductive projection segment in the trench, wherein the conductive projection segment is symmetrical on either side of the heater terminal. The method further includes forming a phase change material layer on the conductive projection segment and capping layer, and forming a phase change material terminal on the phase change material layer, wherein an electrical current can pass between the heater terminal and the phase change material terminal through the phase change material layer.

In accordance with yet another embodiment of the present invention, a phase change memory device is provided. The phase change memory device includes a spacer layer on a substrate, and a heater terminal contact in the spacer layer. The phase change memory device further includes a liner layer on the heater terminal contact and the spacer layer, and a heater terminal in electrical contact with the heater terminal contact in the liner layer. The phase change memory device further includes a conductive projection segment on the heater terminal. The phase change memory device further includes a patterned phase change material layer on the conductive projection segment, and a patterned phase change material terminal on the patterned phase change material layer, wherein an electrical current can pass between the heater terminal and the patterned phase change material terminal through the patterned phase change material layer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide a phase change memory device having a patterned projection segment on a heater terminal. The projection segment can act as a parallel resistor that allows current to pass around an amorphous volume of the phase change material. For a dome-shaped amorphous volume of the phase change material, a projection segment having the shape of a bar that is straight, tapered, flared, or a combination thereof, can provide improved linearity in the resistance of the memory device. The amorphous volume of the phase change memory material can cover more or less of the projection segment with programming pulses. In various embodiments, two intersecting projection segments can be formed that provide a cross (+) or X shape that can provide lower resistance of the projection segment.

Embodiments of the present invention provide a method of fabricating a phase change memory device having a patterned projection segment on a heater terminal. A trench can be formed above a heater terminal that can be filled with a conductive material to form a projection segment, which can be bar-shaped. In various embodiments, two intersecting bars can be formed to make a cross or X shape that can provide lower resistance of the projection segment.

Embodiments of the present invention provide a phase change memory device that has linear resistance for a range of sizes of the amorphous phase change region without resistance drift due to changes in the amorphous volume of the phase change material. The patterned projection segment can provide controllable read state resistance and a high current density during write cycles. The patterned projection segment can provide an alternate current path to phase change material outside the amorphous volume of the PCM.

Exemplary applications/uses to which the present invention can be applied include, but are not limited to: static memory devices, storage class memory, embedded cache memory, and weight storage for analog computing applications.

It is to be understood that aspects of the present invention will be described in terms of a given illustrative architecture; however, other architectures, structures, substrate materials and process features and steps can be varied within the scope of aspects of the present invention.

Figure 1:
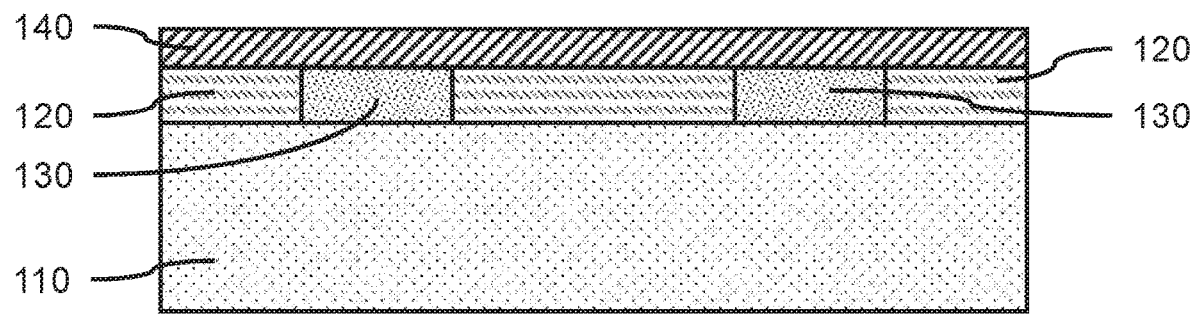
FIG. 1 is a cross-sectional side view of a plurality of heater terminal contacts on a substrate, and a liner layer on the heater terminal contacts, in accordance with an embodiment of the present invention.

Referring now to the drawings in which like numerals represent the same or similar elements and initially to FIG. 1, a cross-sectional side view of a plurality of heater terminal contacts on a substrate, and a liner layer on the heater terminal contacts is shown, in accordance with an embodiment of the present invention.

In one or more embodiments, a spacer layer 120 can be formed on a substrate 110, where the spacer layer 120 can be formed by a conformal deposition, for example, atomic layer deposition (ALD), plasma enhanced ALD (PEALD), a blanket deposition, for example, chemical vapor deposition (CVD), plasma enhanced CVD (PECVD), physical vapor deposition (PVD), or a combination thereof. The spacer layer 120 can cover at least a portion of the substrate 110 for fabricating phase change memory devices.

In various embodiments, the spacer layer 120 can have a thickness in a range of about 20 nanometers (nm) to about 300 nm, or about 60 nm to about 400 nm, or about 100 nm to about 300 nm, although other thicknesses are also contemplated. The spacer layer 120 can be sufficiently thick to form the heater terminal contacts 130 that can carry the current used to read and write data to the phase change memory devices.

In various embodiments, the substrate 110 can be a semiconductor substrate or semiconductor-on-insulator (SeOI) substrate. A semiconductor-on-insulator (SeOI) substrate can include an active semiconductor layer on an insulating layer on a carrier layer. The semiconductor material can include a semiconductor material, including, but not limited to, a group IV semiconductor, for example, silicon (Si) or germanium (Ge), a group IV-IV semiconductor, for example, silicon-germanium (SiGe) or silicon carbide (SiC), a group III-V semiconductor, for example, gallium arsenide (GaAs), gallium nitride (GaN), indium phosphide (InP), aluminum gallium arsenide (AlGaAs), and combinations thereof.

In one or more embodiments, one or more heater terminal contacts 130 can be formed in the spacer layer 120 on a substrate 110. The heater terminal contacts 130 can be formed by patterning the spacer layer 120 using lithographic techniques and etching to form one or more openings. The heater terminal contacts 130 can be separated by a distance sufficient to form separate phase change memory devices. The heater terminal contacts 130 can be part of a conductor layer.

In various embodiments, the spacer layer 120 can be an electrically insulating dielectric layer that can surround the sides of the heater terminal contacts 130. The spacer layer 120 can be an electrically insulating dielectric, including, but not limited to, silicon oxide (SiO), silicon nitride (SiN), silicon oxynitride (SiON), silicon carbide (SiC), silicon carbonitride (SiCN), silicon boro carbonitride (SiBCN), and combinations thereof.

In various embodiments, the heater terminal contacts 130 can be a conductive material, including, but not limited to, a metal, for example, copper (Cu), tungsten (W), cobalt (Co), molybdenum (Mo), tantalum (Ta), a metal compound, for example, titanium nitride (TiN), tantalum nitride (TaN), tungsten nitride (WN), or a combination thereof.

In one or more embodiments, a liner layer 140 can be formed on the heater terminal contacts 130 and spacer layer 120, where the liner layer can be formed by a conformal deposition, for example, atomic layer deposition (ALD), plasma enhanced ALD (PEALD), a blanket deposition, for example, chemical vapor deposition (CVD), plasma enhanced CVD (PECVD), physical vapor deposition (PVD), or a combination thereof. The liner layer 140 can cover the heater terminal contacts 130 to provide electrical insulation of the heater terminal contacts.

In various embodiments, the liner layer 140 can be an electrically insulating dielectric material, including, but not limited to, silicon oxide (SiO), silicon nitride (SiN), silicon oxynitride (SiON), silicon carbide (SiC), silicon carbonitride (SiCN), silicon boro carbonitride (SiBCN), and combinations thereof. The liner layer 140 can be a different electrically insulating dielectric material from the spacer layer 120, so the liner layer 140 can be selectively removed, for example, by a reactive ion etch (RIE).

In various embodiments, the liner layer 140 can have a thickness in a range of about 10 nanometers (nm) to about 100 nm, or about 30 nm to about 60 nm, or about 50 nm, although other thicknesses are also contemplated. The thickness of liner layer 140 can determine the height of a subsequently formed heater terminal. The thicker the liner layer 140, the better the thermal isolation of subsequently formed heater terminals, but also the greater the electrical resistance of the heater terminals due to the increase conductive path.

Figure 2:
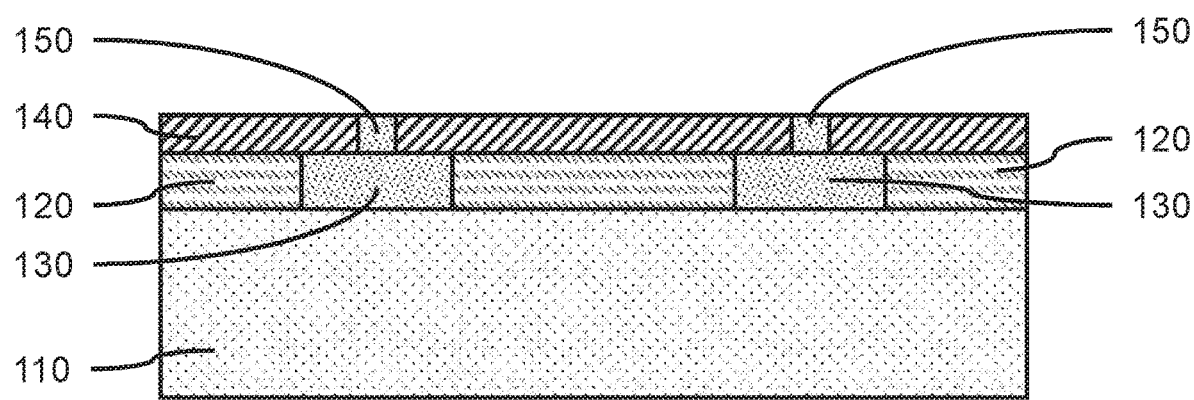
FIG. 2 is a cross-sectional side view showing a heater terminal formed in the liner layer on each of the heater terminal contacts, in accordance with an embodiment of the present invention.

FIG. 2 is a cross-sectional side view showing a heater terminal formed in the liner layer on each of the heater terminal contacts, in accordance with an embodiment of the present invention.

In one or more embodiments, the liner layer 140 can be patterned and etched (e.g., by RIE) to form a hole (e.g., a via) through the liner layer 140 to an underlying heater terminal contact 130. A portion of the top surface of the heater terminal contact 130 can be exposed by the hole. A conductive material can be formed in the hole using a deposition process, for example ALD, PEALD, CVD, PECVD, or a combination thereof. A chemical-mechanical polishing (CMP) can be used to remove excess conductive material from the surface of the liner layer 140 to form a heater terminal 150 in each of the holes. The heater terminal 150 can be in electrical contact with the underlying heater terminal contact 130.

In various embodiments, the heater terminal(s) 150 can be square, rectangular, or circular, where a circular heater terminal can have a diameter in a range of about 5 nm to about 30 nm, or about 10 nm to about 20 nm, although other radii are also contemplated. The heater terminal(s) 150 can be square or rectangular and can have a width in a range of about 5 nm to about 30 nm, or about 10 nm to about 20 nm, although other widths are also contemplated. The heater terminal(s) 150 can be smaller than the underlying heater terminal contact 130 to allow a current pulse to heat the heater terminal(s) 150. The smaller the top area of the heater terminal(s) 150 in thermal contact with a phase change material, the lower the current that may be used to amorphized the phase change material of the device.

Figure 3:
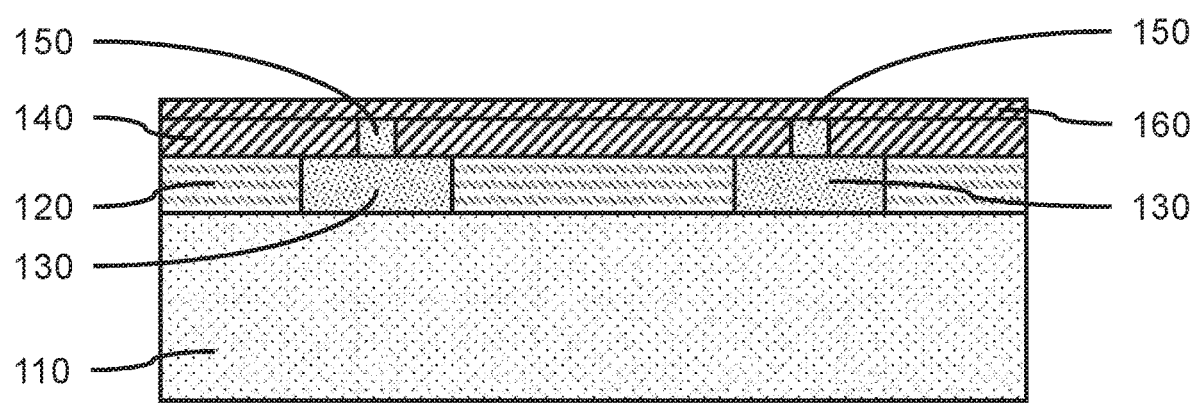
FIG. 3 is a cross-sectional side view showing a capping layer on the heater terminal and liner layer, in accordance with an embodiment of the present invention.

FIG. 3 is a cross-sectional side view showing a capping layer on the heater terminal and liner layer, in accordance with an embodiment of the present invention.

In one or more embodiment, a capping layer 160 can be formed on the liner layer 140 and the heater terminal(s) 150, where the capping layer 160 can be formed by a conformal deposition (e.g., ALD, PEALD). The capping layer 160 can cover the heater terminal(s) 150.

In various embodiments, the capping layer 160 can have a thickness in a range of about 1 nanometer (nm) to about 10 nm, or about 3 nm to about 6 nm, although other thicknesses are also contemplated. The capping layer 160 can determine the thickness of the projection segment. The capping layer 160 may be as thin as possible to avoid increasing the resistance of the low resistance state of the device.

In various embodiments, the capping layer 160 can be an electrically insulating dielectric material, including, but not limited to, silicon oxide (SiO), silicon nitride (SiN), silicon oxynitride (SiON), silicon carbide (SiC), silicon carbonitride (SiCN), silicon boro carbonitride (SiBCN), and combinations thereof. The capping layer 160 can be the same electrically insulating dielectric material as the liner layer 140.

Figure 4:
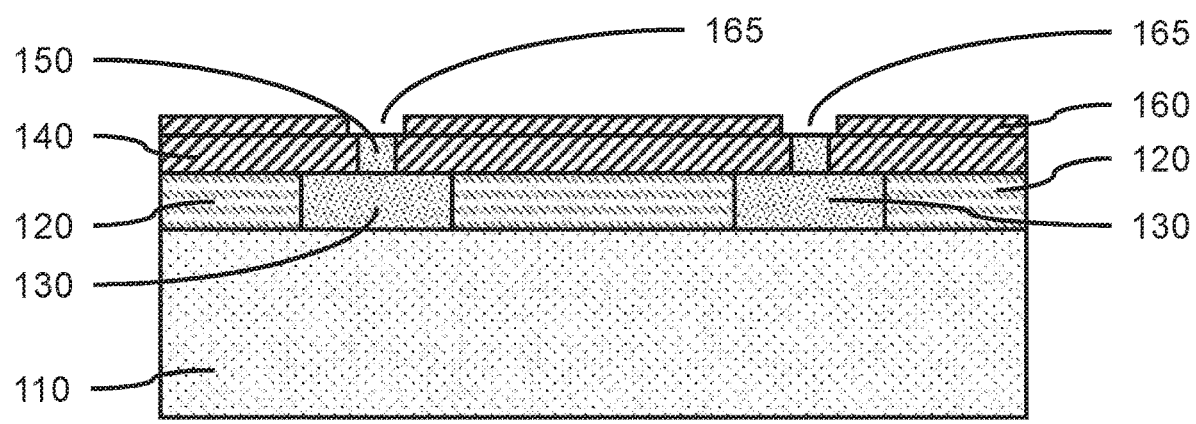
FIG. 4 is a cross-sectional side view showing a trench formed in the capping layer above the heater terminals, in accordance with an embodiment of the present invention.

FIG. 4 is a cross-sectional side view showing a trench formed in the capping layer above the heater terminals, in accordance with an embodiment of the present invention.

In one or more embodiments, a trench 165 can be formed in the capping layer 160 on top of each of the heater terminals 150, where the trench(es) 165 can be formed by lithography and etching (e.g., RIE), such that the top surface of the underlying heater terminal 150 is exposed. The trenches can have a shape that provides current paths away from the underlying heater terminal 150 and a region of a subsequently formed phase change material above the heater terminal.

In various embodiments, the trench(es) 165 can be rectangular and have an essentially uniform width in a range of about 10 nm to about 80 nm, or about 20 nm to about 80 nm, or about 10 nm to about 50 nm, or about 20 nm to about 50 nm, within lithographic tolerances. In various embodiments, the trench can have a width that is greater than the width or diameter of the underlying heater terminal 150. In various embodiments, the width of the trench(es) 165 can be greater than the width or radius of the heater terminal 150 to allow electrical current passing through the heater terminal 150 to bypass an amorphous region of a phase change material above the heater terminal 150. In other embodiments, the trench(es) 165 can be narrower than the heater terminal 150.

In various embodiments, the trench 165 can have a length in a range of about 50 nm to about 300 nm, or about 100 nm, to about 200 nm, although other lengths are also contemplated.

In various embodiments, the trench(es) 165 can be straight, have a flared shape, a tapered shape, or a compound shape (i.e., having both flared and tapered portions). The trench(es) 165 can extend to opposite sides of a heater terminal 150, where the trench can be symmetrical or asymmetrical on opposite sides of a heater terminal 150. The heater terminal 150 can be circular or square and the width of the trench 165 can increase in a direction away from the heater terminal 150 to form a flared shape, or decrease in a direction away from the heater terminal 150 to form a tapered shape. The trench 165 can also initially increase in a direction away from the heater terminal 150 to form a flared shape and then decrease further away from the heater terminal 150 to form a tapered shape, the combination of which forms a compound shape. The end of the trench can be flat or taper essentially to a point. The shape of the trench can determine the surface area of an amorphous volume of a phase change material that is in contact with the capping layer 160 and the amount of surface area that is in contact with a subsequently formed projection segment.

Figure 5:
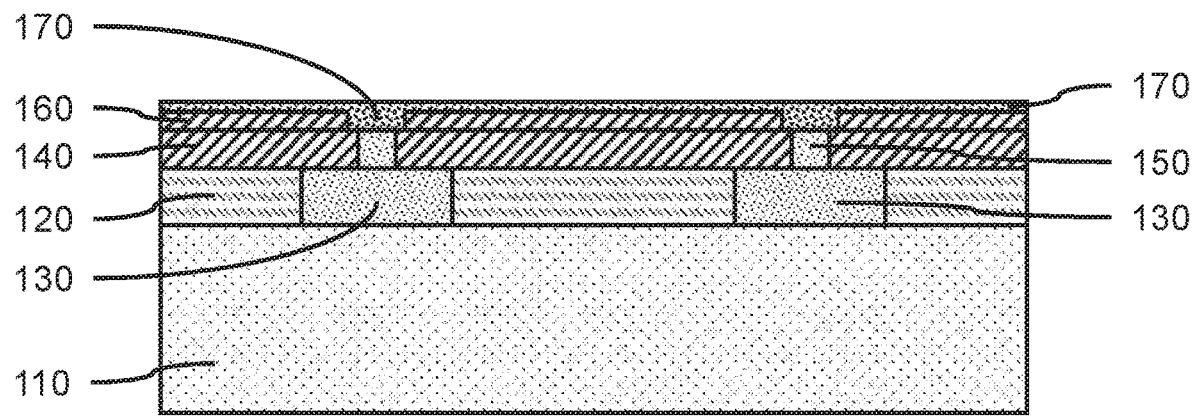
FIG. 5 is a cross-sectional side view showing a conductive projection layer formed on the capping layer and in the trenches, in accordance with an embodiment of the present invention.

FIG. 5 is a cross-sectional side view showing a conductive projection layer formed on the capping layer and in the trenches, in accordance with an embodiment of the present invention.

In one or more embodiments, a conductive projection layer 170 can be formed on the capping layer 160 and in the trenches 165, where the conductive projection layer 170 can be formed by a conformal deposition (e.g., ALD, PEALD), a blanket deposition (e.g., CVD, PECVD, PVD), or a combination thereof. The conductive projection layer 170 can fill in the trenches 165 and cover the capping layer 160. The conductive projection layer 170 can be in electrical contact with the heater terminal 150.

In one or more embodiments, a conductive projection layer 170 can be formed on the liner layer 140 and heater terminal 150, without forming the capping layer 160 and the trench(es) 165, such that the conductive projection layer 170 can be directly on the liner layer 140. The conductive projection layer 170 can be formed by a conformal deposition (e.g., ALD, PEALD), a blanket deposition (e.g., CVD, PECVD, PVD), or a combination thereof. In various embodiments, the conductive projection layer 170 can be patterned to form the conductive projection segment 175 on the heater terminal 150 using masking, lithographic processes, and etching (e.g., RIE). The conductive projection segment 175 can be in electrical contact with the heater terminal 150. The conductive projection segment 175 can be wider than the heater terminal 150, such that a portion of the patterned conductive projection segment 175 remains on the liner layer 140 and forms a step, where the top surface of the conductive projection segment 175 is above the top surface of the liner layer 140. The conductive projection segment 175 can have a straight rectangular shape, a flared shape, a tapered shape, or a compound shape.

In one or more embodiments, the conductive projection layer 170 can be made of a metal compound, including, but not limited to, metal nitrides, for example, titanium nitride (TiN), tantalum nitride (TaN), tungsten nitride (WN), and combinations thereof; metal silicides, for example, titanium silicide (TiSi), cobalt silicide (CoSi), nickel silicide (NiSi), and combinations thereof; and metal carbides, for example, titanium carbide (TiC), tantalum carbide (TaC), a higher resistance metal, for example, tungsten (W), cobalt (Co), platinum (Pt), palladium (Pd), or tantalum (Ta), and combinations thereof.

Figure 6:
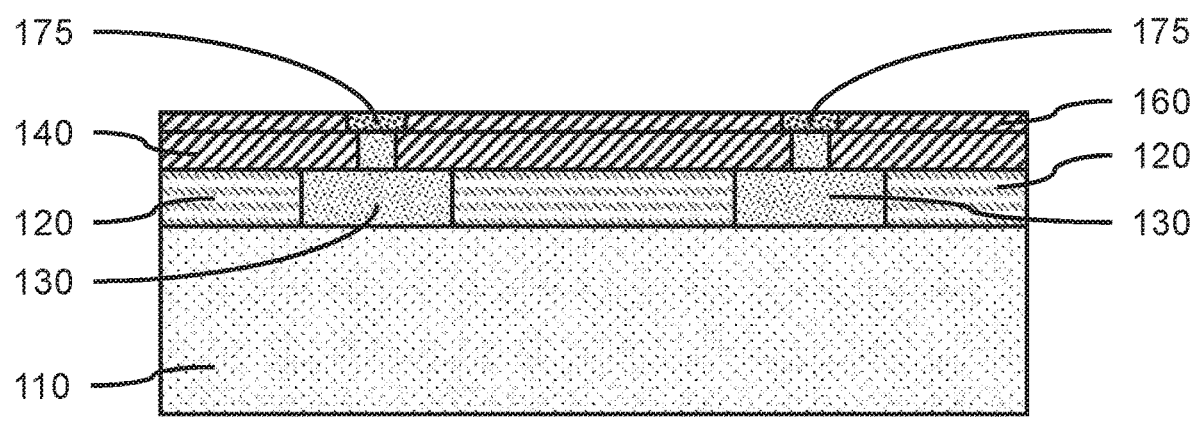
FIG. 6 is a cross-sectional side view showing a portion of the conductive projection layer removed from the surface of the capping layer while remaining in the trenches, in accordance with an embodiment of the present invention.

FIG. 6 is a cross-sectional side view showing a portion of the conductive projection layer removed from the surface of the capping layer while remaining in the trenches, in accordance with an embodiment of the present invention.

In one or more embodiments, a portion of the conductive projection layer 170 can be removed from the capping layer 160 while remaining in the trenches 165, where the portion of the conductive projection layer 170 can be removed using a chemical-mechanical polishing (CMP). Removal of the portion of the conductive projection layer 170 can form a conductive projection segment 175 in each of the trenches 165, where the conductive projection segment 175 can have the shape of the trench 165 in which it is formed.

Figure 7:
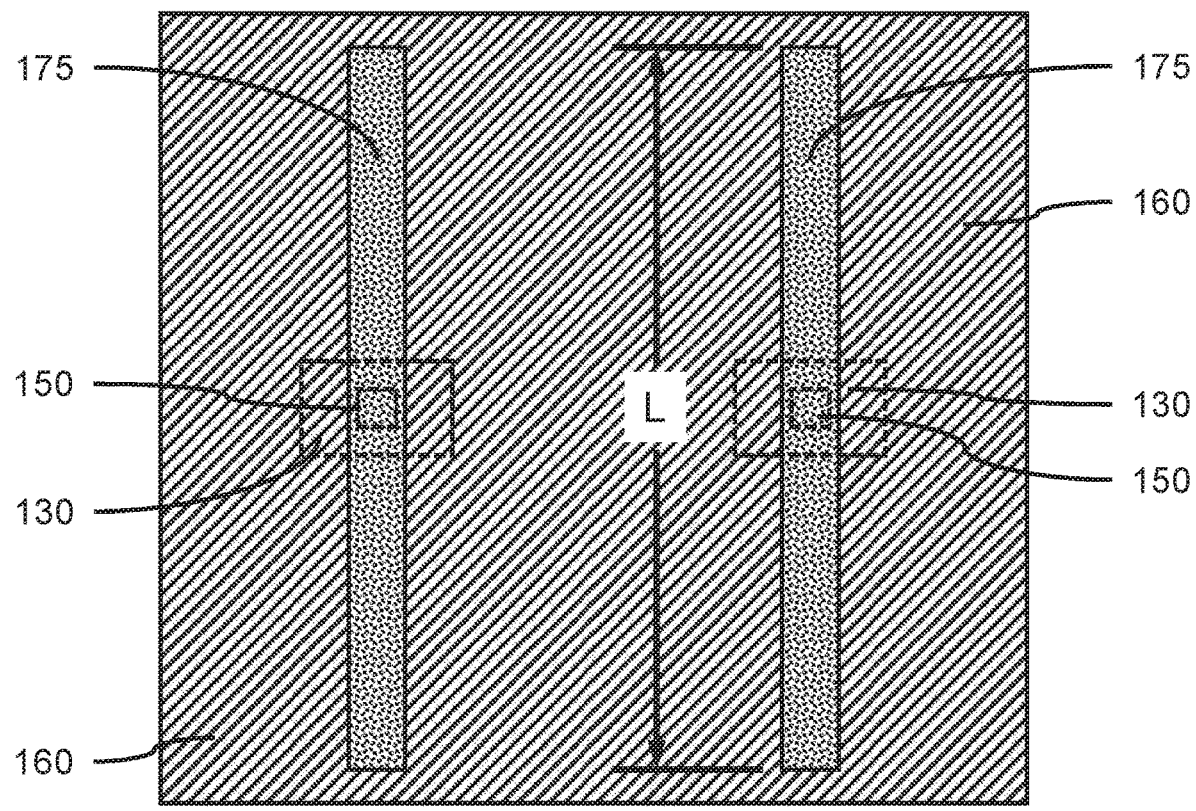
FIG. 7 is a top view showing the conductive projection segments in the trenches above the heater terminals, in accordance with an embodiment of the present invention.

FIG. 7 is a top view showing the conductive projection segments in the trenches above the heater terminals, in accordance with an embodiment of the present invention.

In one or more embodiments, a conductive projection segment 175 can extend laterally away from each underlying heater terminal 150, where the heater terminal 150 is in electrical contact with the conductive projection segment 175. The conductive projection segment 175 can extend laterally to opposite sides of the heater terminal 150, or towards each of four quadrants to form an "X" or "+" (i.e., cross) shape. The patterned conductive projection segment 175 and smaller heater terminal 150 can provide higher current density during a write cycle and controllability of the read state resistance. The heating of the phase change material can be focused to the area adjacent to the heater terminal 150, while the read current can bypass the amorphous region of the PCM through the conductive projection segment 175.

In various embodiments, the conductive projection segment 175 can have a length, L, in a range of about 50 nm to about 300 nm, or about 100 nm, to about 200 nm, although other lengths are also contemplated, where the length can be the same as the length of the trench 165. The conductive projection segment 175 can be symmetrical on either side of the heater terminal 150, or asymmetrical, having different lengths on either side of the heater terminal 150. The exposed surface can be the capping layer 160. The heater terminal 150 and underlying heater terminal contact 130 can be beneath the conductive projection segment 175.

Figure 8:
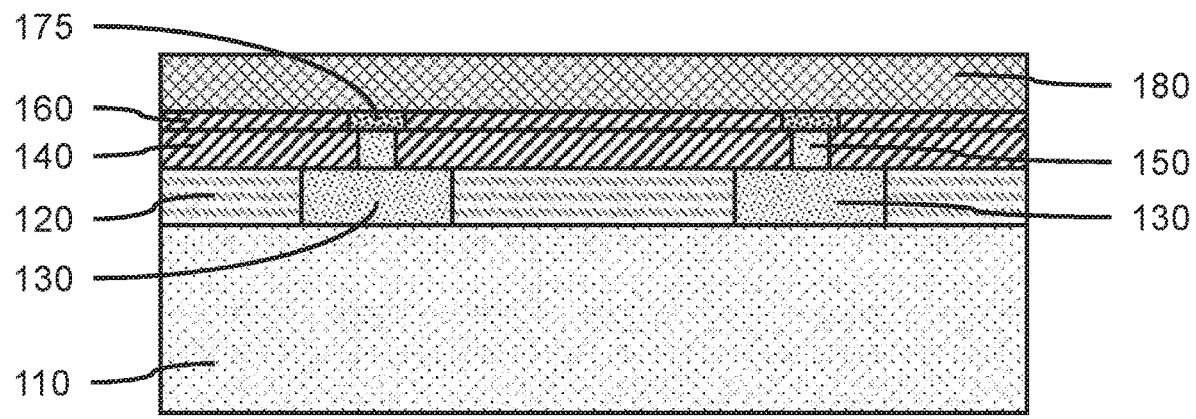
FIG. 8 is a cross-sectional side view showing a phase change material layer on the conductive projection segments and the capping layer, in accordance with an embodiment of the present invention.

FIG. 8 is a cross-sectional side view showing a phase change material layer on the conductive projection segments and the capping layer, in accordance with an embodiment of the present invention.

In one or more embodiments, a phase change material layer 180 can be formed on the conductive projection bars 175 and the exposed surface of the capping layer 160, where the phase change material layer 180 can be formed by a blanket deposition (e.g., CVD, PECVD, PVD, and combinations thereof). The phase change material layer 180 can cover the conductive projection bars 175 and the capping layer 160.

In various embodiments, the phase change material layer 180 can be $Ge_2Sb_2Te_5$ (GST), where the GST can have a crystalline phase and an amorphous phase, where the crystalline phase has a lower resistivity than the amorphous phase. The crystalline phase can be changed into the amorphous phase by heating the crystalline phase to a phase change temperature and quickly reducing the temperature of the amorphous phase change material to quench the phase change material in the amorphous phase. In various embodiments, conversion of the phase change material (PCM) to an amorphous phase from a crystalline phase can be accomplished by passing a suitable current through the heater terminal contact 130 and heater terminal 150, where the current can be a current pulse.

In various embodiments, the phase change material layer 180 can have a thickness in a range of about 10 nm to about 150 nm, or about 60 nm to about 100 nm, although other thicknesses are also contemplated. The phase change material layer 180 can have a thickness sufficient to provide space for a hemispherical or dome-shaped region of an amorphous phase. The height and lateral size of the hemispherical or dome-shaped region of the amorphous phase change material can be determined by the current pulse and localized heating at the heater terminal 150.

Figure 9:
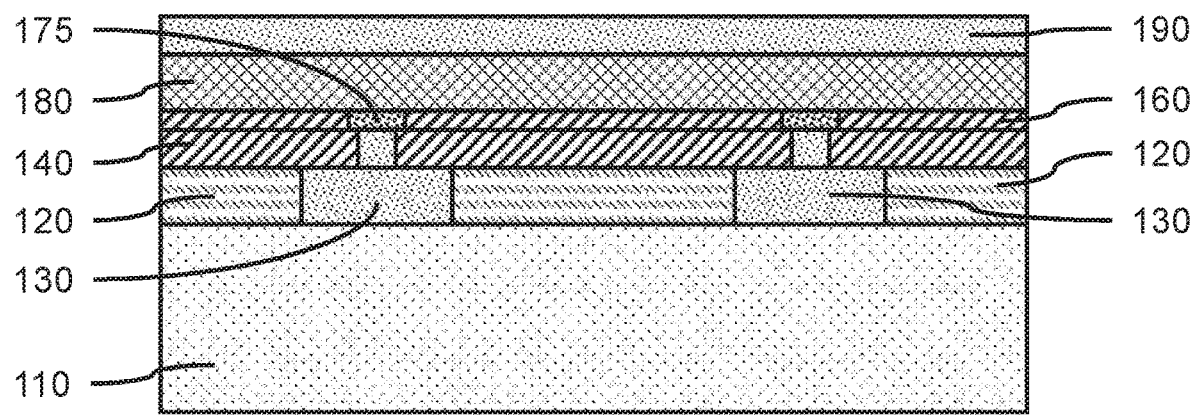
FIG. 9 is a cross-sectional side view showing a phase change material terminal on the phase change material layer, in accordance with an embodiment of the present invention.

FIG. 9 is a cross-sectional side view showing a phase change material terminal on the phase change material layer, in accordance with an embodiment of the present invention.

In one or more embodiments, a phase change material terminal 190 can be formed on the phase change material layer 180, where the phase change material terminal 190 can be formed by a blanket deposition (e.g., CVD, PECVD, PVD, and combinations thereof). The phase change material terminal 190 can be in electrical contact with the phase change material layer 180.

In various embodiments, the phase change material terminal 190 can have a thickness in a range of about 20 nm to about 120 nm, or about 20 nm to about 80 nm, or about 40 nm to about 120 nm, although other thicknesses are also contemplated.

In various embodiments, the phase change material terminal 190 can be a conductive material, including, but not limited to, a metal, for example, copper (Cu), tungsten (W), cobalt (Co), molybdenum (Mo), tantalum (Ta), a metal compound, for example, titanium nitride (TiN), tantalum nitride (TaN), tungsten nitride (WN), or a combination thereof. An electrical current can pass between the heater terminal 150 and the phase change material terminal 190 through the phase change material layer 180 as part of a read cycle or write cycle.

Figure 10:
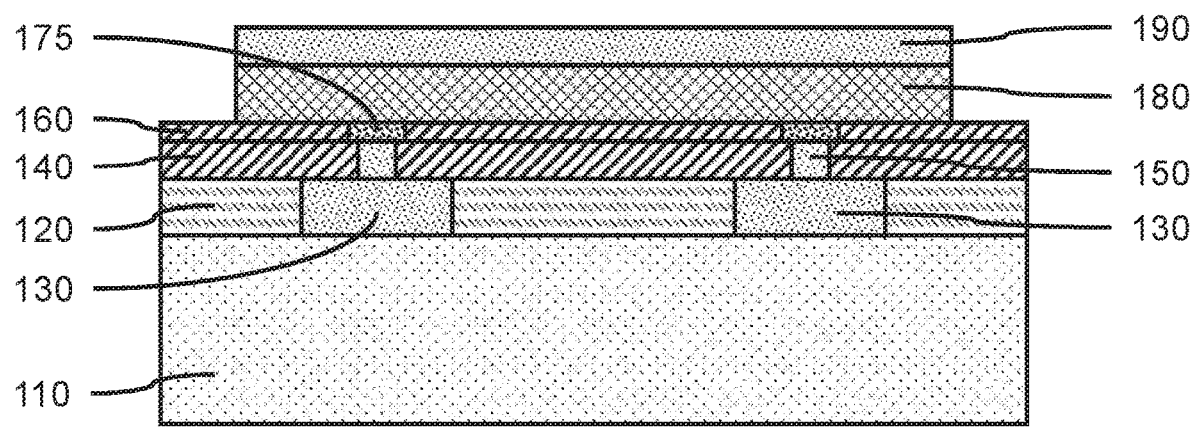
FIG. 10 is a cross-sectional side view showing the phase change material terminal and the phase change material layer patterned over the conductive projection segments, in accordance with an embodiment of the present invention.

FIG. 10 is a cross-sectional side view showing the phase change material terminal and the phase change material layer patterned over the conductive projection segments, in accordance with an embodiment of the present invention.

In one or more embodiments, the phase change material terminal 190 and the phase change material layer 180 can be patterned and etched to remove portions of the phase change material terminal 190 and the phase change material layer 180 extending away from the heater terminal(s) 150. The phase change material terminal 190 and the phase change material layer 180 can be patterned using lithographic techniques and directional etching (e.g., RIE). A portion of the capping layer 160 can be exposed around the patterned phase change material terminal 190 and the phase change material layer 180 to form a region surrounding the patterned phase change material terminal 190 and the phase change material layer 180.

Figure 11:
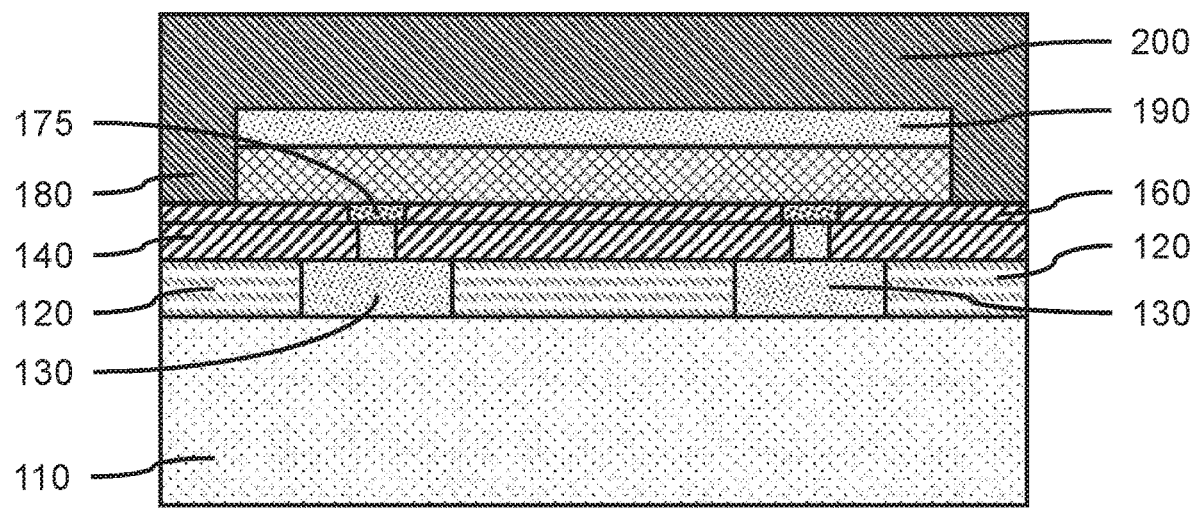
FIG. 11 is a cross-sectional side view showing an insulating layer over the patterned phase change material terminal and phase change material layer, in accordance with an embodiment of the present invention.

FIG. 11 is a cross-sectional side view showing an insulating layer over the patterned phase change material terminal and phase change material layer, in accordance with an embodiment of the present invention.

In one or more embodiments, an insulating layer 200 can be formed over the patterned phase change material terminal 190 and phase change material layer 180, where the insulating layer 200 can encapsulate the patterned phase change material terminal 190 and phase change material layer 180 with the capping layer 160. The insulating layer 200 can protectively seal the sides and top of the patterned phase change material terminal 190 and phase change material layer 180.

In various embodiments, the insulating layer 200 can be an electrically insulating dielectric material, including, but not limited to, silicon oxide (SiO), silicon nitride (SiN), silicon oxynitride (SiON), low-k dielectric materials, and combinations thereof. A low-k dielectric material can be, for example, fluorine doped silicon oxide (SiO:F), carbon doped silicon oxide (SiO:C), hydrogen silsesquioxane (HSQ) and methylsilsesquioxane (MSQ), tetraethoxysilane (TEOS), and combinations thereof.

The insulating layer 200 can be sufficiently thick to extend to the exposed surface of the capping layer 160 and cover the top surface of the patterned phase change material terminal 190.

Figure 12:
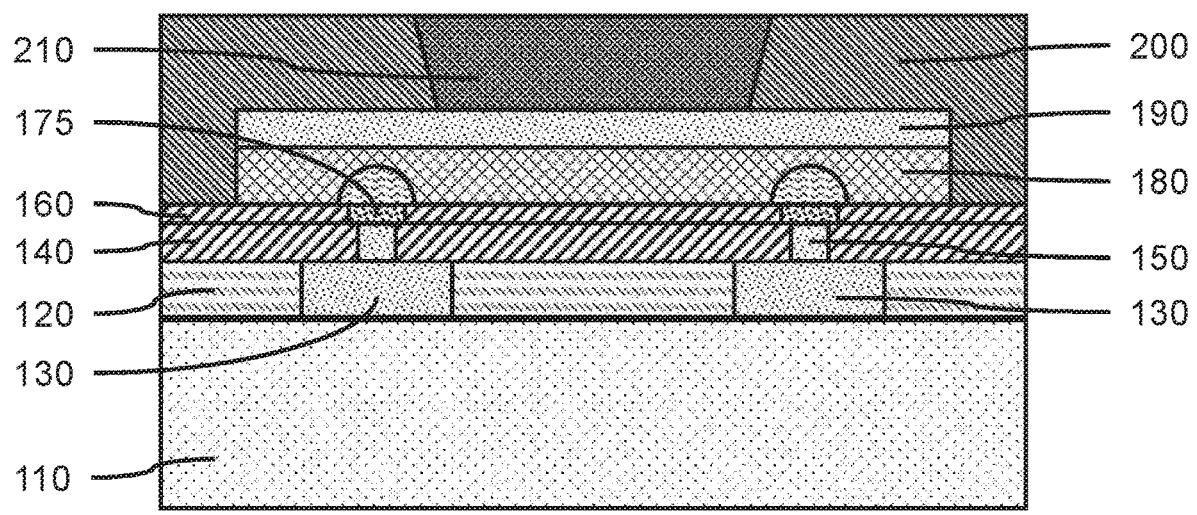
FIG. 12 is a cross-sectional side view showing a terminal contact on the patterned phase change material terminal, in accordance with an embodiment of the present invention.

FIG. 12 is a cross-sectional side view showing a terminal contact on the patterned phase change material terminal, in accordance with an embodiment of the present invention.

In one or more embodiments, a terminal contact 210 can be formed on the patterned phase change material terminal 190, where the terminal contact 210 can be formed by patterning and etching a channel in the insulating layer 200 using lithographic techniques and etching (e.g., RIE), and filling the channel with a conductive material. The conductive material can be a metal, for example, copper (Cu), tungsten (W), cobalt (Co), molybdenum (Mo), tantalum (Ta), a metal compound, for example, titanium nitride (TiN), tantalum nitride (TaN), tungsten nitride (WN), or a combination thereof.

Figure 13:
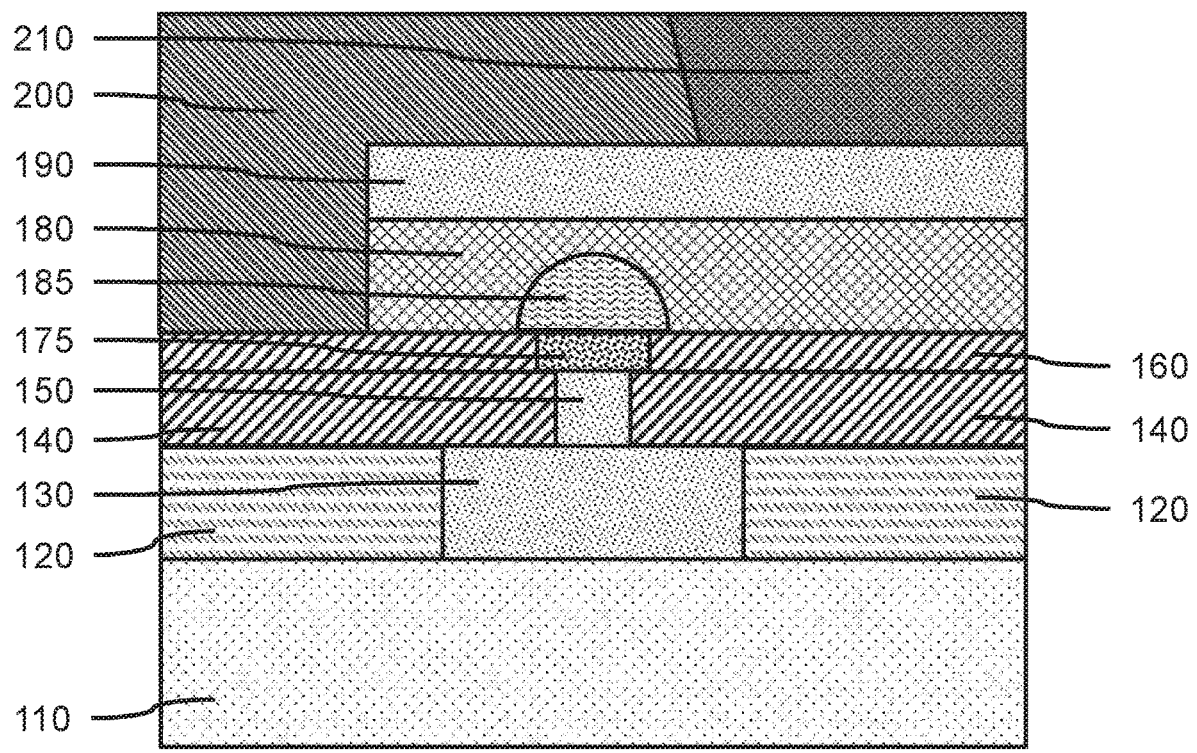
FIG. 13 is a close-up cross-sectional side view showing two phases of the phase change material (PCM) on one of the conductive projection segments, in accordance with an embodiment of the present invention.

FIG. 13 is a close-up cross-sectional side view showing two phases of the phase change material (PCM) on one of the conductive projection segments, in accordance with an embodiment of the present invention.

In various embodiments, a region of the patterned phase change material layer 180 can be converted to an amorphous phase 185, where the amorphous phase region can be a projection having a hemispherical or dome shape adjoining the top surface of the conductive projection segment 175 above the heater terminal 150. The amorphous phase region 185 of the phase change material layer 180 can be hemispherical with a radius in a range of about 40 nanometers (nm) to about 70 nm, or about 50 nm to about 60 nm, although other radii are also contemplated. The dome shape can have a different or greater height than the radius. The heating of the PCM can be symmetrical around the heater terminal(s) 150. The conductive projection segment 175 can be larger than the amorphous phase region 185 and extend to either side of the amorphous phase region 185 to provide a current path for a read cycle that does not cross the amorphous phase 185.

In various embodiments, a read current passed from the heater terminal 150 to the patterned phase change material terminal 190 can bypass the amorphous phase region 185 of the PCM by flowing through the conductive projection segment 175 on opposite sides of the amorphous phase region 185 and through the crystalline phase of the PCM 180, which has a lower resistivity than the amorphous phase 185, to the phase change material terminal 190. By having the read current bypass the volume of the amorphous phase region 185, the drift in the resistance of the phase change memory device can be reduced or eliminated to provide a linear region of resistances. The linear resistances can allow the phase change memory device to be used as an analog memory device with consistent memory states that can be read.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," when used herein, specify the presence of stated features, integers, steps, operations, elements and/or components, but do not preclude the presence or addition of one or more other features, integers, steps operations, elements, components and/or groups thereof.

Spatially relative terms, such as "beneath," "below," "lower" "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below", or "beneath" other elements or features would then be oriented "above" the other e rets or features. Thus, the term "below" can encompass both an ion of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a phase change memory device, comprising:
    forming a spacer layer on a substrate;
    forming a heater terminal contact in the spacer layer;
    forming a liner layer on the heater terminal contact and the spacer layer;
    forming a heater terminal in electrical contact with the heater terminal contact in the liner layer;
    forming a conductive projection segment on the heater terminal, wherein the conductive projection segment is wider than the heater terminal and has a length, L, that extends to opposite sides of the heater terminal;
    forming a phase change material layer on the conductive projection segment; and
    forming a phase change material terminal on the phase change material layer, wherein an electrical current can pass between the heater terminal and the phase change material terminal through the phase change material layer.

2. The method of claim 1, further comprising forming a capping layer on the liner layer and the heater terminal, forming a trench in the capping layer above the heater terminal, and forming the conductive projection segment in the trench.

3. The method of claim 1, further comprising forming a conductive projection layer directly on the liner layer and heater terminal, and patterning the conductive projection layer to form the conductive projection segment on the heater terminal.

4. The method of claim 1, wherein the conductive projection segment has a shape extending to opposite sides of the heater terminal that is selected from the group consisting of a straight rectangular shape, a flared shape, a tapered shape, or a compound shape.

5. The method of claim 4, further comprising patterning the phase change material terminal and phase change material layer.

6. The method of claim 5, further comprising forming an insulating layer over the patterned phase change material terminal and phase change material layer.

7. The method of claim 6, further comprising forming a terminal contact in the insulating layer on the patterned phase change material terminal.

8. The method of claim 7, wherein the phase change material layer is $Ge_2Sb_2Te_5$ (GST).

9. The method of claim 8, wherein the conductive projection segment is symmetrical on either side of the heater terminal.

10. A method of forming a phase change memory device, comprising:
    forming a spacer layer on a substrate having a thickness in a range of about 20 nanometers (nm) to about 300 nm;
    forming a heater terminal contact in the spacer layer;
    forming a liner layer on the heater terminal contact and the spacer layer;

forming a heater terminal in electrical contact with the heater terminal contact in the liner layer;

forming a capping layer on the liner layer and the heater terminal;

forming a trench in the capping layer above the heater terminal;

forming a conductive projection segment in the trench, wherein the conductive projection segment is symmetrical on either side of the heater terminal;

forming a phase change material layer on the conductive projection segment and capping layer; and forming a phase change material terminal on the phase change material layer, wherein an electrical current can pass between the heater terminal and the phase change material terminal through the phase change material layer.

11. The method of claim 10, wherein the phase change material layer has a thickness in a range of about 10 nm to about 150 nm, and wherein the liner layer has a thickness in a range of about 10 nm to about 100 nm.

12. The method of claim 11, wherein the phase change material layer is $Ge_2Sb_2Te_5$ (GST).

13. The method of claim 12, wherein the conductive projection segment has a shape extending to opposite sides of the heater terminal that is selected from the group consisting of a straight rectangular shape, a flared shape, a tapered shape, or a compound shape.

14. The method of claim 13, wherein the conductive projection segment has a length in a range of about 50 nm to about 300 nm.

15. A phase change memory device, comprising:
a spacer layer on a substrate;
a heater terminal contact in the spacer layer;
a liner layer on the heater terminal contact and the spacer layer;
a heater terminal in electrical contact with the heater terminal contact in the liner layer;
a conductive projection segment on the heater terminal, wherein the conductive projection segment is wider than the heater terminal and has a length, L, that extends to opposite sides of the heater terminal;
a patterned phase change material layer on the conductive projection segment; and
a patterned phase change material terminal on the patterned phase change material layer, wherein an electrical current can pass between the heater terminal and the patterned phase change material terminal through the patterned phase change material layer.

16. The phase change memory device of claim 15, further comprising a capping layer on the liner layer and the heater terminal, and a trench in the capping layer above the heater terminal, wherein the conductive projection segment is in the trench.

17. The phase change memory device of claim 15, wherein the conductive projection segment has a length in a range of about 50 nm to about 300 nm.

18. The phase change memory device of claim 17, wherein the conductive projection segment extending to opposite sides of the heater terminal is symmetrical on either side of the heater terminal.

19. The phase change memory device of claim 18, wherein the patterned phase change material layer is $Ge_2Sb_2Te_5$ (GST).

20. The phase change memory device of claim 19, further comprising an insulating layer over the patterned phase change material terminal and patterned phase change material layer, and wherein the heater terminal is circular with a diameter in a range of about 5 nm to about 30 nm.

* * * * *